May 29, 1962 J. W. SKERRITT 3,037,132

MONOSTABLE MULTIVIBRATOR

Filed Dec. 31, 1959

INVENTOR
JOHN W. SKERRITT

BY Edgar H. Kent
ATTORNEY

United States Patent Office 3,037,132

Patented May 29, 1962

3,037,132

MONOSTABLE MULTIVIBRATOR

John W. Skerritt, Kingston, N.Y., assignor to International Business Machines Corporation, New York, N.Y., a corporation of New York Filed Dec. 31, 1959, Ser. No. 863,361
6 Claims. (Cl. 307—88.5)

This invention is related to monostable multivibrators and more particularly to an improved monostable multivibrator adapted to generate a pulse of accurate width independent of wide variations in input and output conditions.

Conventional monostable multivibrators (or single shots) generally consist of two cross-coupled inverter stages with conventional bistable multivibrator (flip-flop) crossover networks. A capacitor discharge circuit is placed in one of the cross coupling networks and the discharging rate of that capacitor controls the duration of the output pulse. In conventional monostable multivibrator circuitries the capacitor is driven during the initial switching period and the discharge rate of the capacitor may be affected by pulses applied to the input terminal of the circuitry during the discharging period. This produces a variable length output. Conventional single shots are also subject to other similar disturbing influences which adversely affect the accuracy of the output signal. Additionally the duration of the output pulse cannot be readily and accurately adjusted over a wide range in the circuitries commonly utilized in the prior art.

Accordingly it is an object of this invention to provide a new and improved monostable multivibrator circuit.

A more particular object of the invention is to provide a new and improved monostable multivibrator circuit which produces an output pulse of accurate time duration.

Still another object of the invention is to provide a new and improved monostable multivibrator circuit in which the width of the output pulse is easily adjustable over a wide range independent of variations in conditioning environments.

Still another object of the invention is to provide a monostable multivibrator circuit particularly adapted to accomplish frequency division and accurately timed pulse channeling.

The invention provides a monostable multivibrator circuit in which conventional cross-coupled inverter stages are utilized. The input pulse which initiates the generation of the output level is applied to one stage and switches the condition of the inverter stages to initiate the generation of the output level. Simultaneously with this switch of the conditions of the inverters a capacitor starts to discharge through a resistance and the input circuit of a control transistor that is in saturated condition. As the voltage level changes on the capacitor the control transistor starts to turn off, with a resulting change in output voltage level which is coupled back so that the conditions of the inverter stages are reversed, thus terminating the pulse output. In the preferred embodiment a transistor connected in grounded emitter configuration is utilized as each inverter stage and the input pulse is applied through an emitter follower stage which provides isolation. The independent pulse width controlling circuitry includes a capacitor that is charged prior to and is not driven during the initial switching operation, thereby providing a sharp leading edge of the output signal. An emitter follower output stage is utilized to drive the control capacitor at the end of the output signal. The emitter follower output stage configuration also insures a rapid terminating transition of the output signal and enables the driving of large capacitive loads. The circuitry according to the invention produces an output signal of precise pulse width which can be easily and accurately adjusted over a wide range of pulse widths. One embodiment of the circuit, responsive to input pulses applied at a ten megacycle pulse repetition frequency, produces output pulses having accurate widths up to five hundred microseconds in duration. Another embodiment has been utilized in a magnetic core test circuit to provide accurate output pulses several seconds in duration in response to input pulses having a 100 kilocycle pulse repetition frequency.

Other objects and advantages of the invention will be seen as the following description of a preferred embodiment thereof progresses in conjunction with the drawing, in which.

Figure 1:
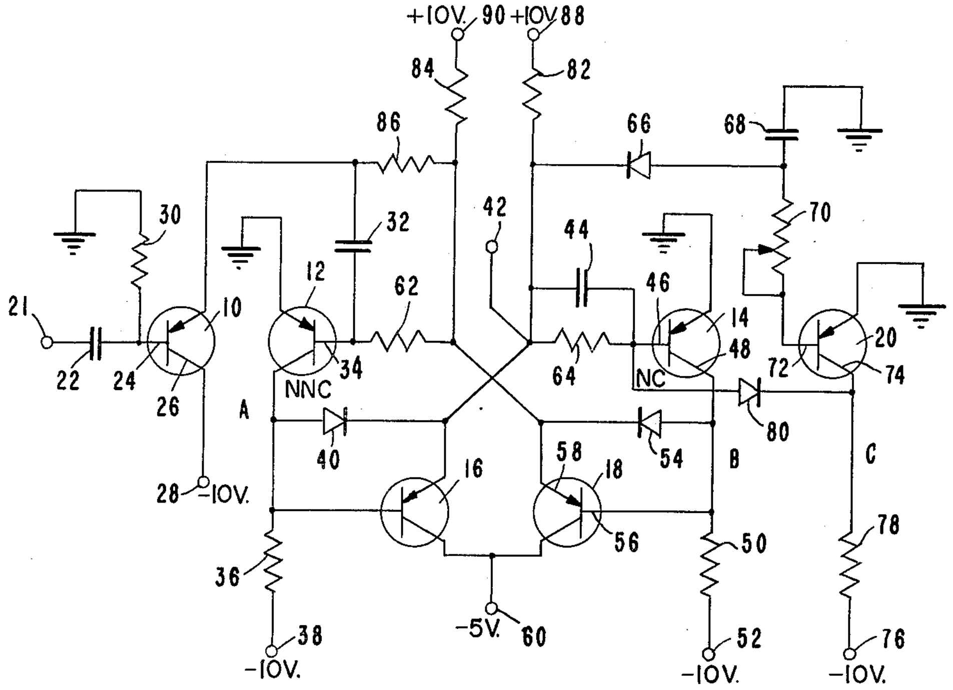
FIG. 1 is a schematic diagram of the monostable multivibrator according to the preferred embodiment of the invention.

The monostable multivibrator circuit shown in FIG. 1 utilizes six PNP transistors 10, 12, 14, 16, 18 and 20. Transistor 10 is connected in emitter follower configuration and negative input pulses applied at terminal 21 are coupled through capacitor 22 to its base electrode 24. The collector electrode 26 is connected to a −10 volt source at terminal 28 and the base electrode is connected to ground through a resistor 30 which provides a path for $I_{co}$. Transistors 12 and 14 are cross-coupled inverter stages, each being connected in grounded emitter configuration. Associated with the output circuit of each inverter stage 12, 14 is an output stage, each of which includes a transistor 16, 18 respectively which is connected in emitter follower configuration. Normally transistor 12 is in nonconductive state and transistor 14 is in conductive state. Similarly output transistor 16 is normally conducting in saturation and transistor 18 is conducting in the active region. The pulse coupled through input transistor 10 when its emitter base junction becomes forward biased is applied through capacitor 32 to the base electrode 34 of transistor 12, turning that transistor on. The collector of transistor 12 is supplied through resistor 36 from terminal 38, to which a −10 v. source is connected. However, before transistor 12 turns on, its collector voltage (point A) is clamped at a potential slightly more negative than that of terminal 60 (−5 volts) by the base-collector diode of saturated emitter follower 16. When transistor 12 turns on, its collector potential rises to approximately ground and that voltage rise is coupled through diode 40 to the output terminal 42. The output emitter follower stage 16 is turned off momentarily by this voltage rise. Thus, the voltage at the output terminal rises substantially to ground, to which level it is held by conduction of transistor 16 in the active region.

This output rise transition is coupled through capacitor 44 to the base electrode 46 of transistor 14 turning that transistor off so that the collector potential at its collector electrode 48 falls from approximately zero volts toward −10 volts as applied to the collector through the resistor 50 from terminal 52. The diode 54 remains back biased and as the base electrode 56 becomes negative with respect to the collector electrode of transistor 18, that transistor goes into saturation. Current then flows from the −5 volt potential at terminal 60 through collector-base diode of transistor 18 and resistor 50, effectively clamping the collector of transistor 14 (point B) at approximately −5 volts. This potential change is applied through the series connection of resistor 86 and capacitor 32 and through cross-coupling resistor 62 to the base electrode 34 of transistor 12 to maintain that transistor in conductive condition. Resistor 64 also continues to couple the output voltage level to the base of transistor 14 so that both inverters are maintained in this reversed state.

Prior to the switching of the inverter stages the output terminal 42 was at −5 volts and this potential was coupled through the forward biased diode 66 to charge the capacitor 68 and to hold that capacitor charged to that −5 volts potential. Base current for transistor 20 flowed through potentiometer 70, diode 66 and transistor 16 from terminal 60 to maintain transistor 20 in saturated condition. The series circuit of the capacitor 68, the potentiometer 70 and the input circuit of transistor 20 controls the output pulse width of this single shot. When the inverters are switched the rise in output voltage level applied at terminal 42 back biases the diode 66 and permits the capacitor 68 to discharge through the variable potentiometer 70 and the input circuit of transistor 20. As the potential at the base electrode 72 of transistor 20 rises, that transistor starts to cut-off and the potential on the collector electrode 74 begins to fall from zero volts towards −10 volts (applied from terminal 76 through resistor 78). When this occurs the diode 80 becomes forward biased and pulls the base electrode 46 of transistor 14 down, turning that transistor on. As transistor 14 turns on, its collector potential rises towards ground and the resulting voltage transition is coupled through the diode 54 and the series combination of resistor 86 and capacitor 32 and also through the feedback resistor 62 to the base 34 to turn the transistor 12 off. This transition drops the collector potential of transistor 12 and that drop is coupled through emitter follower stage 16 to output terminal 42 which therefore rapidly falls towards −5 volts. This transition thus provides a sharp termination of the output pulse. As the potential at the output terminal 42 falls the diode 66 becomes forward biased, permitting the capacitor 68 to again charge, and putting transistor 20 back into saturation preparatory to another application of an input pulse at terminal 21. The resistors 82 and 84 connected to a +10 volt source at terminals 88 and 90, provide suitable biasing levels.

The following is a list of suitable types and values of components for one embodiment of the invention:

| | |
|---|---|
| Transistors (all) | Philco MADT |
| Diodes (all) | Transitron T6G |
| Capacitor **22** | 470 μμf. |
| Capacitor **32** | 150 μμf. |
| Capacitor **44** | 100 μμf. |
| Capacitor **68** | .002 μf. |
| Resistor **30** | 2,000 ohms |
| Resistor **36** | 620 ohms |
| Resistor **50** | 620 ohms |
| Resistor **62** | 5,000 ohms |
| Resistor **64** | 5,000 ohms |
| Resistor **78** | 10,000 ohms |
| Resistor **82** | 1,500 ohms |
| Resistor **84** | 1,500 ohms |
| Resistor **86** | 150 ohms |
| Potentiometer **70** | 500,000 ohms |

Figure 2:
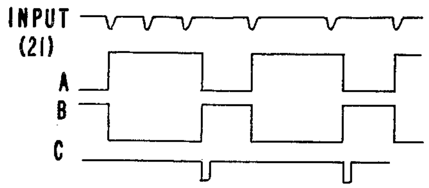
FIG. 2 is a diagram indicating wave forms obtained at specific points in the circuit of FIG. 1.

The duration of the output pulse thus is accurately controlled by the RC discharge circuit which includes the capacitor 68, the variable potentiometer 70, and the input circuit of the transistor 20. This circuitry is isolated from the inverter circuitry by the diodes 66 and 80 and thus is independent of the output levels produced by the switched inverters. Illustrative voltage waveforms of the single shot circuitry at points A, B, and C (the collectors of transistors 12, 14 and 20 respectively) are indicated in FIG. 2. The single shot circuitry produces an output of accurate time duration independent of intervening input pulses, is rapidly reset and is then responsive to the next applied input pulse. The width of the output pulse is easily adjustable by changing the setting of potentiometer 70 or the size of capacitor 68. Where output pulses of longer duration are desired the diode 66 may be replaced by a transistor connected in emitter follower configuration and the size of the capacitor 68 then may be substantially increased without adverse effect on the output pulse width. Such a modified circuit has been used to produce output pulses several seconds in duration.

The circuit has a particularly advantageous application in conjunction with a suitable gate circuit in a frequency dividing network in which it renders the gate circuit insensitive to input pulses during the duration of its output signal and thus permits the gate to pass only the single pulse immediately following the termination of the monostable multivibrator output signal.

Figure 3:
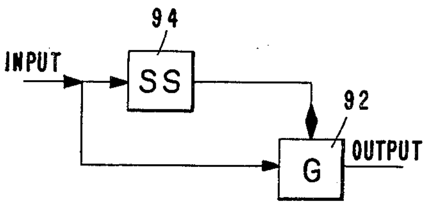
FIG. 3 is a logical block diagram of a frequency divider circuit including a monostable multivibrator constructed in accordance with principles of the invention and a suitable cooperating gate circuit.
Figure 4:
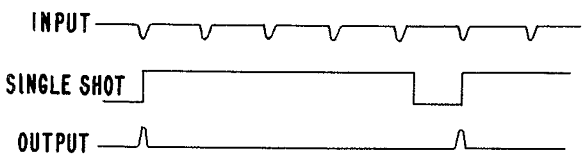
FIG. 4 is a diagram indicating wave forms obtained at specific points in the circuitry of FIG. 3.

A logical block diagram of this circuitry and an associated waveform diagram are shown in FIGS. 3 and 4 respectively. The input signal is applied simultaneously to the single shot 92 and the gate circuit 94. The resulting single shot output level renders the gate inoperative for a precise length of time, even though input signals are constantly being applied thereto. The next input pulse applied after removal of the single shot level is passed by the gate and simultaneously actuates the single shot so that the cycle is repeated. Thus single output pulses are generated at accurately spaced intervals. Conventionally frequency division has been accomplished with a flip-flop register in which each flip-flop divides the pulse repetition frequency by a factor of two. With the highly accurate monostable multivibrator circuitry of the invention there is a substantial saving in equipment where a frequency division factor of even a moderate amount is involved. The circuitry has been utilized in a frequency dividing arrangement where pulses of five megacycle p.r.f. have been applied to a Tektronix 517 oscilloscope at an eighty kilocycle rate with no observable jitter.

The monostable multivibrator according to the invention thus provides an accurate and flexible tool having a variety of uses. Although the described embodiment utilized PNP transistors exclusively it will be obvious that the invention may be practiced with other types of transistors, for example, with appropriate changes in polarity of signals and in voltage levels, etc. Other changes will be obvious to those having ordinary skill in the art. Therefore, while a preferred embodiment of the invention has been shown and described it will be understood that the invention is not intended to be limited thereto or to details thereof and departures may be made therefrom within the spirit and scope of the invention as defined in the claims.

I claim:

1. A monostable multivibrator circuit adapted to generate an output signal of predetermined duration in response to an input signal, comprising an input terminal, an output terminal, first and second electronic switching devices, each having a conductive and a nonconductive condition, cross-coupling means connected between said first and second devices for maintaining said devices in their respective conditions, said multivibrator circuit being arranged so that said first device is in nonconductive condition and said second device is in conductive condition when said circuit is in its stable condition, means for applying an input signal via said input terminal to one of said devices, said input signal being adapted to render said first device conductive and said second device nonconductive, thus initiating an output signal at said output terminal, and an output signal duration controlling circuit operative in response to the initiation of said output signal including a capacitance, an assymmetrically conductive device connected between said output terminal and said capacitance, a resistance, and a transistor having an input circuit and an output circuit, said asymmetrically conductive device being poled to permit charging of said capacitance to a predetermined potential when said circuit is in its stable state and said output signal duration controlling circuit being arranged upon initiation of said output signal to enable discharge of said capacitance from said predetermined potential through said resistance and the input circuit of said transistor so that said transistor is decreased in conductivity after a predetermined time, and coupling means associated with the output circuit of said transistor responsive to the decrease in conductivity of said transistor adapted to translate a signal for causing said first and second devices to return to their stable conductive states so that the output signal is terminated.

2. The circuit as claimed in claim 4 wherein said control transistor has emitter, base and collector electrodes and is connected in grounded emitter configuration with said capacitance being connected in circuit with said base electrode such that said transistor is in saturated condition when said circuit is in said stable state and said capacitance discharges through the emitter base junction of said transistor upon initiation of said output signal, and said means responsive to the change of conductive state of said control transistor means includes asymmetrically conductive means connected to said collector electrode and adapted to translate an output pulse terminating signal upon decrease in conductivity of said transistor.

3. A monostable multivibrator circuit comprising an input terminal, an output terminal, first and second transistors, each said transistor having collector, emitter, and base electrodes, said multivibrator circuit being arranged so that said first transistor is nonconductive and said second transistor is conductive when said circuit is in its stable condition, means for applying an input pulse via said input terminal to the base electrode of said first transistor to thereby render said first transistor conductive and to initiate an output pulse at said output terminal, cross-coupling means connected between said first and second transistors adapted to place said second transistor in nonconductive condition in response to the change in condition of said first transistor and to maintain said first and second transistors in their respective conditions, and an output pulse duration controlling circuit operative in response to the initiation of said output pulse including a capacitor, a resistance, an asymmetrically conductive device connected between said output terminal and said capacitance, and a third transistor, said third transistor normally being in conducting condition, said asymmetrically conductive device being poled to permit charging of said capacitance to a predetermined potential when said circuit is in its stable state and upon initiation of said output pulse to enable discharge of said capacitor from said predetermined potential through said resistance and the input circuit of said third transistor to decrease conductivity of said third transistor, and coupling means responsive to the decrease in conductivity of said third transistor adapted to translate a signal for causing the first and second transistors to return to their stable conductive states so that the output pulse is terminated.

4. A monostable multivibrator circuit adapted to generate an output pulse of accurate time duration in response to an input signal comprising first and second transistors connected as cross-coupled inverters, said first transistor being in conductive state and said second transistor being in nonconductive state when said circuit is in its stable state, each transistor having an input circuit and an output circuit, a transistor arranged in emitter follower configuration connected to the output circuit of one of said inverter transistors, an output terminal connected to said emitter follower transistor, means to apply an input pulse to the input circuit of one of said inverter transistors effective to reverse the conductive states of said inverter transistors, the reversal of conductive states initiating the generation of an output pulse at said output terminal and an output pulse control circuit including a control transistor normally at a first level of conductivity and a capacitance, means including an asymmetrically conductive device connected between said output terminal and said capacitance to charge said capacitance to substantially the potential at said output terminal prior to the initiation of said output pulse and operative on initiation of said output pulse to permit the discharge of said capacitor so that the level of conductivity of said control transistor is changed and means responsive to the change of conductive state of said control transistor adapted to reverse the conductive states of said inverter transistors and to terminate the output pulse.

5. A monostable multivibrator circuit adapted to generate an output signal of predetermined duration in response to an input signal, comprising an input terminal, an output terminal, first and second electronic switching devices, each having a conductive and a non-conductive condition, cross-coupling means connected between said first and second devices for maintaining said devices in their respective conditions, said multivibrator circuit being arranged so that said first device is in non-conductive condition and said second device is in conductive condition when said circuit is in its stable condition, means for applying an input signal via said input terminal to one of said devices, said input signal being adapted to render said first device conductive and said second device non-conductive, thus initiating an output signal at said output terminal, and an output signal duration controlling circuit operative in response to the initiation of said output signal including a capacitance, a resistance, and a transistor having emitter, base and collector electrodes, said transistor being connected in grounded emitter configuration with said resistance being connected to said base electrode such that said transistor is in saturated condition when said circuit is in said stable state, and said output signal duration controlling circuit being arranged upon initiation of said output signal to enable discharge of said capacitance from a predetermined potential through said resistance and the emitter base junction of said transistor so that the conductivity of said transistor is decreased after a predetermined time, and asymmetrically conductive means connected to said collector electrode and responsive to said decrease in conductivity of said transistor to translate an output terminating signal for causing said first and second devices to return to their stable conductive states.

6. A monostable multivibrator circuit adapted to generate an output signal of predetermined duration in response to an input signal, comprising an input terminal, an output terminal, first and second electronic switching devices, each having a conductive and a nonconductive condition, cross-coupling means connected between said first and second devices for maintaining said devices in their respective conditions, said multivibrator circuit being arranged so that said first device is in nonconductive condition and said second device is in conductive condition when said circuit is in its stable condition, means for applyng an input signal via said input terminal to one of said devices, said input signal being adapted to render said first device conductive and said second device nonconductive, thus initiating an output signal at said output terminal, and an output signal duration controlling circuit operative in response to the initiation of said output signal including a control transistor having an input circuit and an output circuit, said control transistor normally being at a first level of conductivity, a capacitance, a resistance, a first asymmetrically conductive device connected between said output terminal and said capacitance, said first asymmetrically conductive device being poled to permit the charging of said capacitance to a predetermined potential when said circuit is in its stable state and, upon initiation of said output signal, to enable discharge of said capacitance from said predetermined potential through the input circuit of said control transistor so that the level of conductivity of said control transistor is changed, and a second asymmetrically conductive means associated with the output circuit of said control transistor responsive to said change in level of conductivity of said control transistor adapted to translate an output signal terminating signal for causing said first and second devices to return to their stable conductive states.

References Cited in the file of this patent

UNITED STATES PATENTS

| | | |
|---|---|---|
| 2,874,315 | Reichert | Feb. 17, 1959 |
| 2,949,582 | Silliman | Aug. 16, 1960 |
| 2,976,432 | Geckle | Mar. 21, 1961 |